(12) United States Patent
Chen et al.

(10) Patent No.: US 12,078,841 B2
(45) Date of Patent: Sep. 3, 2024

(54) BACKLIGHT MODULE AND DISPLAY DEVICE

(71) Applicant: Radiant Opto-Electronics Corporation, Kaohsiung (TW)

(72) Inventors: Chih-Hsiang Chen, Kaohsiung (TW); Cheng-Te Chang, Kaohsiung (TW)

(73) Assignee: Radiant Opto-Electronics Corporation, Kaohsiung (TW)

( * ) Notice: Subject to any disclaimer, the term of this patent is extended or adjusted under 35 U.S.C. 154(b) by 0 days.

(21) Appl. No.: 18/467,464

(22) Filed: Sep. 14, 2023

(65) Prior Publication Data

US 2024/0126006 A1 Apr. 18, 2024

Related U.S. Application Data

(63) Continuation of application No. PCT/CN2022/125838, filed on Oct. 18, 2022.

(51) Int. Cl.
*F21V 8/00* (2006.01)

(52) U.S. Cl.
CPC ........... *G02B 6/009* (2013.01); *G02B 6/0088* (2013.01); *G02B 6/0091* (2013.01); *G02B 6/0068* (2013.01)

(58) Field of Classification Search
CPC .... G02B 6/009; G02B 6/0088; G02B 6/0091; G02B 6/0068
See application file for complete search history.

(56) References Cited

U.S. PATENT DOCUMENTS

| | | | |
|---|---|---|---|
| 8,403,548 B2* | 3/2013 | Kim | G02B 6/0021 362/621 |
| 11,455,049 B2* | 9/2022 | Ahn | G06F 1/16 |
| 2008/0002099 A1* | 1/2008 | Oh | G02B 6/0091 349/65 |

(Continued)

FOREIGN PATENT DOCUMENTS

| | | |
|---|---|---|
| CN | 2725940 Y | 9/2005 |
| CN | 101000433 A | 7/2007 |

(Continued)

OTHER PUBLICATIONS

English translation of TWM321112 Tsai, published 2007 (Year: 2007).*

*Primary Examiner* — Evan P Dzierzynski

(57) ABSTRACT

A backlight module comprises an outer frame unit, a light guide plate arranged in the outer frame unit, a light-emitting unit, a plurality of adhesives for fixing the light-emitting unit on the light guide plate, and a plurality of abutting structures. The light-emitting unit includes a flexible circuit board and a plurality of light-emitting elements arranged on the flexible circuit board at intervals. Part of the flexible circuit board is deformed at a specific position by the abutting structures, and the position of the light-emitting elements relative to the light guide plate can be adjusted. Thereby, the light-emitting elements can be aligned with the light incident surface of the light guide plate, prevent light from leaking from the light emitting surface of the light guide plate close to the light-emitting elements, and reduce the generation of bright lines and improving the overall uniformity. The present invention also provides a display device including the backlight module.

12 Claims, 10 Drawing Sheets

(56) References Cited

U.S. PATENT DOCUMENTS

| | | | | |
|---|---|---|---|---|
| 2008/0037285 A1* | 2/2008 | Eda | ..................... | G02B 6/0083 |
| | | | | 362/634 |
| 2015/0370005 A1 | 12/2015 | Tsai et al. | | |
| 2016/0313487 A1* | 10/2016 | Wang | ................... | G02B 6/0068 |
| 2019/0129092 A1* | 5/2019 | Zhang | ................... | G02B 6/0088 |
| 2019/0163014 A1 | 5/2019 | Sugiyama et al. | | |
| 2020/0292749 A1* | 9/2020 | Ouyang | ............... | G02B 6/0028 |

FOREIGN PATENT DOCUMENTS

| | | | |
|---|---|---|---|
| CN | 102929038 A | | 2/2013 |
| TW | M321112 | * | 10/2007 |
| TW | 200909920 A | | 3/2009 |
| TW | 201516538 A | | 5/2015 |
| TW | M500268 | | 5/2015 |

* cited by examiner

BACKLIGHT MODULE AND DISPLAY DEVICE

RELATED APPLICATIONS

This application is a continuation application of International Application No. PCT/CN2022/125838, filed on Oct. 18, 2022, which claims priority to China Application Serial Number 202211004675.4, filed on Aug. 22, 2022. The entire disclosures of all the above applications are hereby incorporated by reference.

FIELD OF THE INVENTION

The present invention relates to an optical element, particularly a backlight module and a display device capable of improving overall uniformity.

BACKGROUND OF THE INVENTION

Conventional display device generally includes a light source, a frame, and a light guide plate. The light source includes a circuit board and light emitting diodes arranged on the circuit board. The light guide plate is arranged beside the light emitting diodes. The light incident surface of the light guide plate is attached to the light emitting surface of each of the light emitting diodes or there is only a small gap between the light guide plate and the light emitting diodes, so that the light generated from the light emitting diodes can be effectively used.

In some types of backlight modules, the light guide plate is fixed on the circuit board with tapes, However, due to the thickness of the tapes, the light guide plate cannot be completely attached to the circuit board, so that the light-emitting surface of the light emitting diodes cannot be completely aligned with the central axis of the light incident surface of the light guide plate. Therefore, there is a risk of light leakage at the light-emitting surface of the light guide plate close to the light emitting diodes, which is prone to bright bands or uneven brightness, and affects the optical quality of the backlight module.

SUMMARY OF THE INVENTION

One object of the present invention is to provide a backlight module that can avoid the problem of light leakage.

The backlight module comprises an outer frame unit, a light guide plate arranged in the outer frame unit, a light-emitting unit, a plurality of adhesives used to fix the flexible circuit board on the light guide plate, and a plurality of abutting structures. The light guide plate has a light incident surface. The light-emitting unit including a flexible circuit board and a plurality of light-emitting elements arranged at intervals on the flexible circuit board. The flexible circuit board has a first surface and a second surface opposite to the first surface. The light-emitting elements are arranged on the first surface and emit light toward the light incident surface of the light guide plate. The adhesives are arranged at intervals, and each of the light-emitting elements is corresponding to the space between two adjacent adhesives. The abutting structures are arranged corresponding to the position of the light-emitting elements and abut against the second surface of the flexible circuit board, and the flexible circuit board is deformed at the position of the abutting structures.

In a preferable embodiment, the abutting structures are protruding structures formed on the second surface of the flexible circuit board.

In a preferable embodiment, the outer frame unit includes a back frame, the back frame has a carrying section for carrying the light guide plate. The second surface of the flexible circuit board is attached to the carrying section, and the abutting structures abut against the flexible circuit board by the abutment of the carrying section.

In a preferable embodiment, the outer frame unit includes a back frame, the back frame has a carrying section for carrying the light guide plate, a connecting section connected to the carrying section, and an extending section connected to the connecting section and extending in the same direction as the carrying section. The carrying section, the connecting section, and the extending section jointly surround an accommodating space, the light-emitting unit and the light guide plate are limited in the accommodating space. The second surface of the flexible circuit board is attached to the extending section, and the abutting structures abut against the flexible circuit board by the abutment of the extending section.

In a preferable embodiment, the outer frame unit includes a back frame and an upper frame arranged on the back frame, and the back frame and the upper frame jointly surround an accommodating space. The light-emitting unit and the light guide plate are limited in the accommodating space. The second surface of the flexible circuit board is attached to the upper frame, and the abutting structures abut against the flexible circuit board by the abutment of the upper frame.

In a preferable embodiment, the abutting structures are protruding structures formed on the outer frame unit.

In a preferable embodiment, the outer frame unit includes a back frame, the back frame has a carrying section for carrying the light guide plate. The second surface of the flexible circuit board is attached to the carrying section, and the abutting structures are formed on the carrying section and abuts against the flexible circuit board.

In a preferable embodiment, the outer frame unit includes a back frame, the back frame has a carrying section for carrying the light guide plate, a connecting section connected to the carrying section, and an extending section connected to the connecting section and extending in the same direction as the carrying section. The carrying section, the connecting section, and the extending section jointly surround an accommodating space, and the light-emitting unit and the light guide plate are limited in the accommodating space. The second surface of the flexible circuit board is attached to the extending section, and the abutting structures are formed on the extending section and abut against the flexible circuit board.

In a preferable embodiment, the outer frame unit includes a back frame and an upper frame arranged on the back frame, and the back frame and the upper frame jointly surround an accommodating space. The light-emitting unit and the light guide plate are limited in the accommodating space. The second surface of the flexible circuit board is attached to the upper frame, and the abutting structures are formed on the upper frame to abut against the flexible circuit board.

In a preferable embodiment, the first surface of the flexible circuit board has a plurality of fixing areas where the adhesives are disposed and a plurality of setting areas where the light-emitting elements are disposed, and the fixing areas and the setting areas are not coplanar.

In a preferable embodiment, the first surface of the flexible circuit board forms protrusions at the position of the abutting structures and forms a coplanar surface with the surface of the adhesives.

Another object of the present invention is to provide a display device which comprises the backlight module as described above, and a display panel arranged on the backlight module.

The characteristic of the present invention is that the abutting structure cause the flexible circuit board to deform at a specific position, which can compensate for the thickness of the adhesive and adjust the position of the light-emitting element relative to the light guide plate. Therefore, the light-emitting element can be aligned with the light incident surface of the light guide plate to improve the coupling effect between the light guide plate and the light-emitting element. In this way, the risk of light leakage at the position where the light-emitting surface of the light guide plate near to the light-emitting element can be avoided, the generation of bright lines can be reduced, and the overall light uniformity can be improved. It can be beneficial to reduce the overall thickness of the display device and be applied to the design of ultra-thin models.

DETAILED DESCRIPTION OF THE INVENTION

The detailed description and preferred embodiments of the invention will be set forth in the following content and provided for people skilled in the art to understand the characteristics of the invention.

Figure 1:
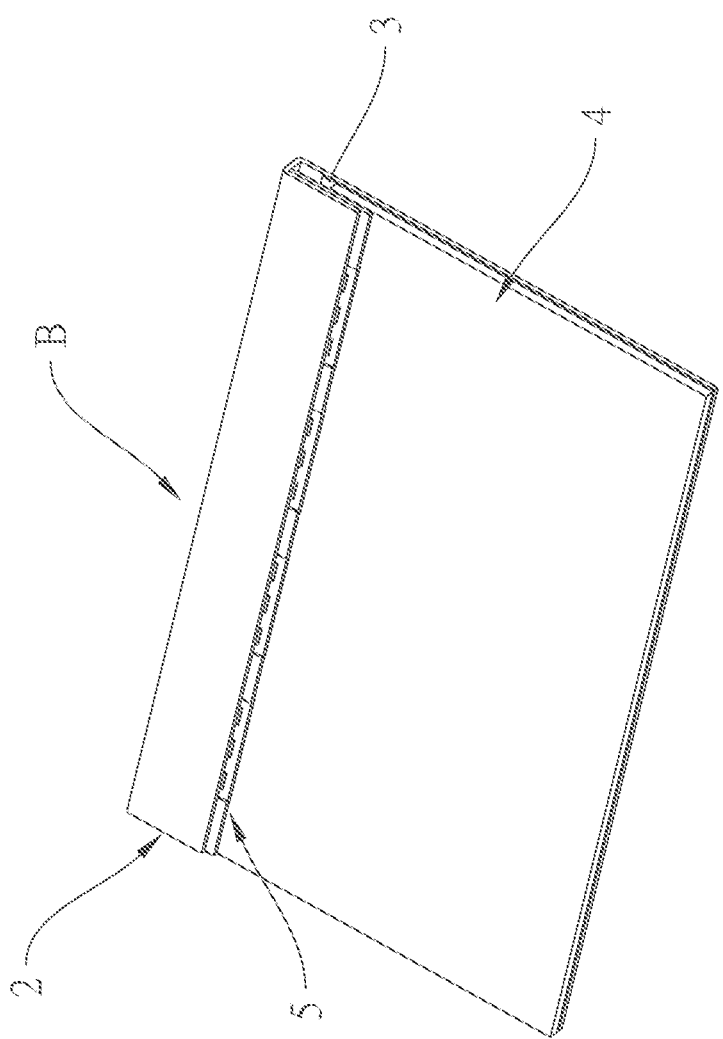
FIG. 1 is a perspective diagram according to a first preferred embodiment of a backlight module of this invention.
Figure 2:
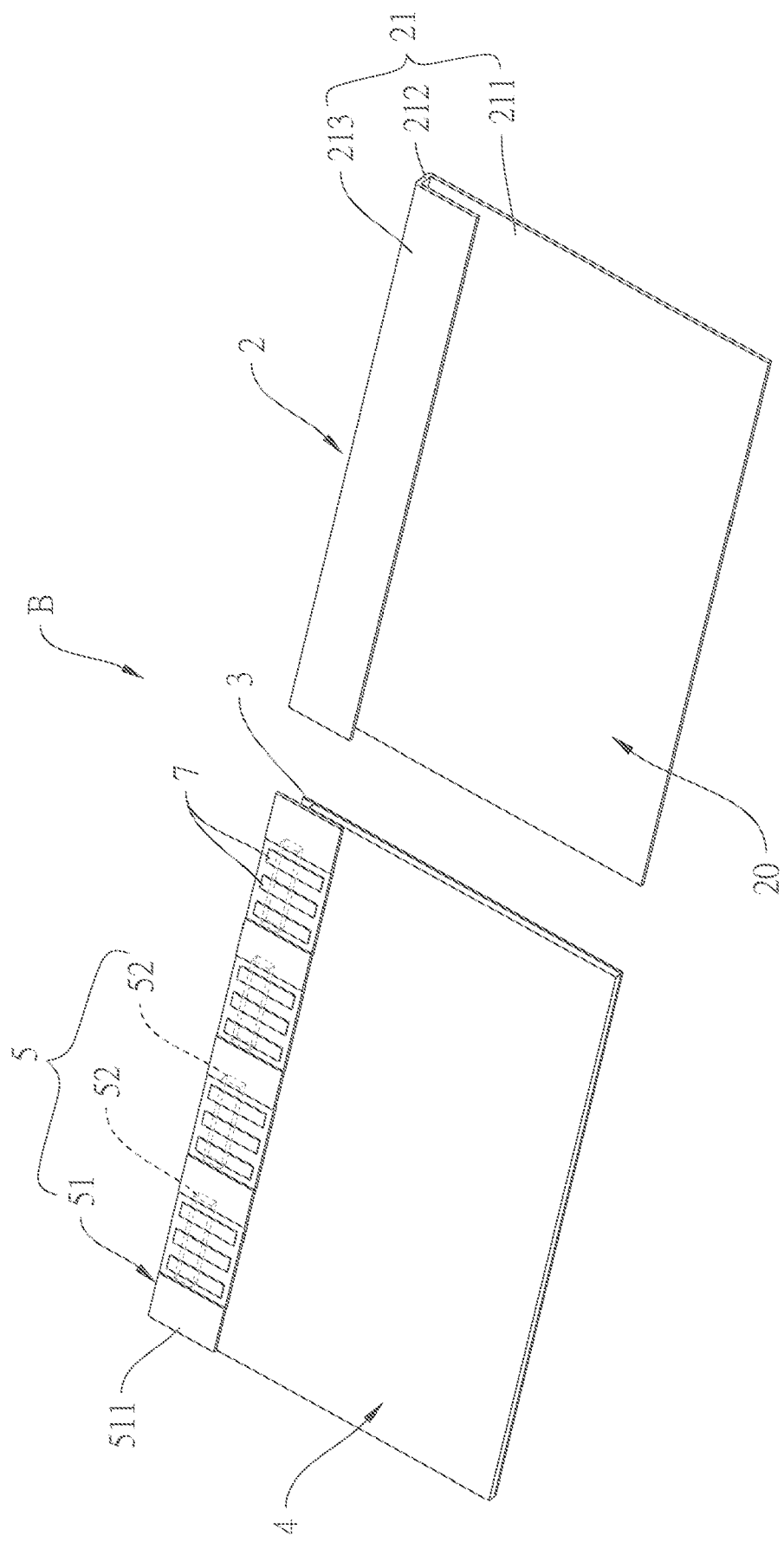
FIG. 2 is a three-dimensional exploded perspective diagram illustrating the internal structure of the first preferred embodiment.

Referring to FIG. 1 and FIG. 2, it is a first preferred embodiment of the backlight module B of the present invention. The backlight module B comprises an outer frame unit 2, a reflector 3 arranged on the outer frame unit 2, a light guide plate 4 arranged in the outer frame unit 2 and on the reflector 3, and a light-emitting unit 5.

Referring to FIG. 2, the outer frame unit 2 includes a back frame 21. The back frame 21 includes a carrying section 211 for carrying the reflector 3 and the light guide plate 4, a connecting section 212 connected to the carrying section 211, and an extending section 213 connected to the connecting section 212 and extending in the same direction as the carrying section 211. The carrying section 211, the connecting section 212, and the extending section 213 jointly surround an accommodating space 20.

Figure 3:
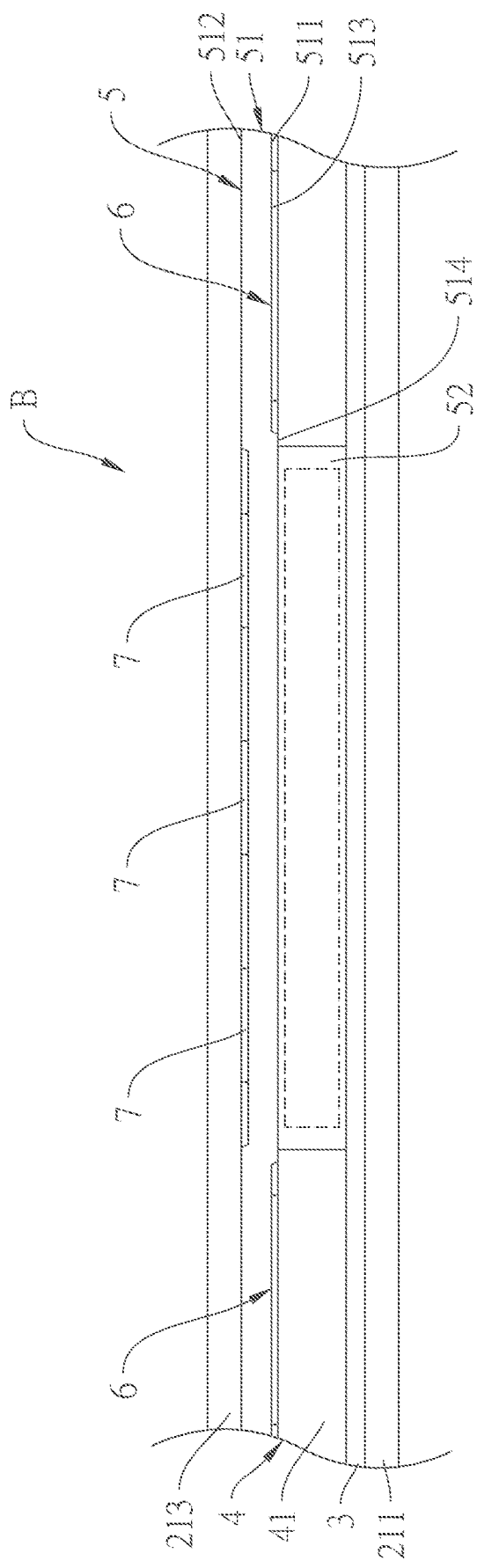
FIG. 3 is a partial sectional diagram illustrating the relative positions between the components in the first preferred embodiment, wherein a flexible circuit board of a light-emitting unit is on the top, and a plurality of light-emitting elements of the light-emitting unit are on the bottom.

Referring to FIG. 2 and FIG. 3, the light-emitting unit 5 includes a flexible circuit board 51 and a plurality of light-emitting elements 52 disposed on the flexible circuit board 51 at intervals. Referring to FIG. 3, the flexible circuit board 51 has a first surface 511 and a second surface 512 opposite to the first surface 511. The light-emitting elements 52 are disposed on the first surface 511 and emits light toward a light incident surface 41 of the light guide plate 4. The light-emitting unit 5 is fixed on the light guide plate 4 through a plurality of adhesives 6. The adhesives 6 are arranged at intervals, and each light-emitting element 52 is corresponding to the space between two adjacent adhesives 6.

In the prior art, an adhesive (e.g. tape) is continuously extended and installed on the light incident surface of the light guide plate instead of being arranged at intervals, which is likely to cause the problem of extended bright lines at the place where light enters, and the luminance will also decrease at the same time. Furthermore, if there are air bubbles happened when attaching the adhesive, it will also cause the problem of uneven brightness and darkness of incident light. The backlight module B disclosed in this embodiment does not use a continuous extension type of the adhesive (e.g. tape), which can avoid the above-mentioned problems such as extended bright lines, the dropping of luminance, and uneven brightness and darkness of incident light.

More specifically, the first surface 511 of the flexible circuit board 51 has a plurality of fixing areas 513 where the adhesives 6 are disposed, and a plurality of setting areas 514 where the light-emitting elements 52 are disposed.

Referring to FIG. 2 and FIG. 3, the backlight module B also includes a plurality of abutting structures 7, and the abutting structures 7 are set corresponding to the positions of the light-emitting elements 52. In more detail, the abutting structures 7 abut against the flexible circuit board 51 from the second surface 512, which can compensate the thickness of the adhesives 6. In this way, the flexible circuit board 51 is deformed at the positions of the abutting structures 7, or the height of the flexible circuit board 51 is changed at the positions of the abutting structures 7. Therefore, the positions of the light-emitting elements 52 relative to the light guide plate 4 can be adjusted to align with the light guide plate 4, improving the coupling effect between the light guide plate 4 and the light-emitting elements 52, and avoiding the risk of light leakage. The above design is beneficial to reduce the overall thickness of the display device to meet the trend of thinning and can be applied to the design of ultra-thin models.

In this embodiment, the abutting structures 7 are protruding structures formed on the second surface 512 of the flexible circuit board 51. For example, the abutting structures 7 can use ink printing, other types of materials or microstructures to form protruding structures on the second surface 512 of the flexible circuit board 51, which should not be limited to the description of this embodiment.

The light guide plate 4 is combined with the first surface 511 of the flexible circuit board 51 with the adhesives 6 when assembling. Next, the light guide plate 4 and the light-emitting unit 5 are placed and limited in the accommodating space 20. At this time, as shown in FIG. 3, the second surface 512 of the flexible circuit board 51 is attached to the extending section 213 of the back frame 21. Since the abutting structures 7 are protruding from the second surface 512, after the light guide plate 4 and the light-emitting unit 5 are positioned, the abutting structures 7 will abut against the flexible circuit board 51. The flexible circuit board 51 is deformed at the positions of the abutting structures 7, or the height of the flexible circuit board 51 is changed at the positions of the abutting structures 7 to compensate the thickness of the adhesives 6. That is, after the flexible circuit board 51 is pushed by the abutting structures 7, the fixing areas 513 and the setting areas 514 will be not coplanar, and the setting areas 514 (corresponding to the position of the abutting structures 7) will form downward protrusions to form a coplanar surface with the surface of the adhesives 6. At the same time, the light-emitting elements 52 disposed in the setting areas 514 are moved downward, and then the position of the light-emitting elements 52 relative to the light guide plate 4 is adjusted to align with the light incident surface 41 of the light guide plate 4. In this way, the coupling effect between the light guide plate 4 and the light-emitting elements 52 is improved, and the risk of light leakage is reduced.

According to the present invention, the setting of the abutting structures 7 can abut against the position corresponding to the light-emitting elements 52 on the flexible circuit board 51 by utilizing the flexibility of the flexible circuit board 51 to generate deformation to compensate for the thickness of adhesives 6. In this way, the position of the light-emitting elements 52 relative to the light guide plate 4 are adjusted, and the coupling effect between the light guide plate 4 and the light-emitting elements 52 is optimized. At the same time, it prevents light from leaking from the light-emitting surface of the light guide plate 4 close to the position of the light-emitting elements 52, reduces the generation of bright lines, and improves the overall uniformity. The above design is beneficial to reduce the overall thickness of the display device to meet the trend of thinning and can be applied to the design of ultra-thin models.

Figure 4:
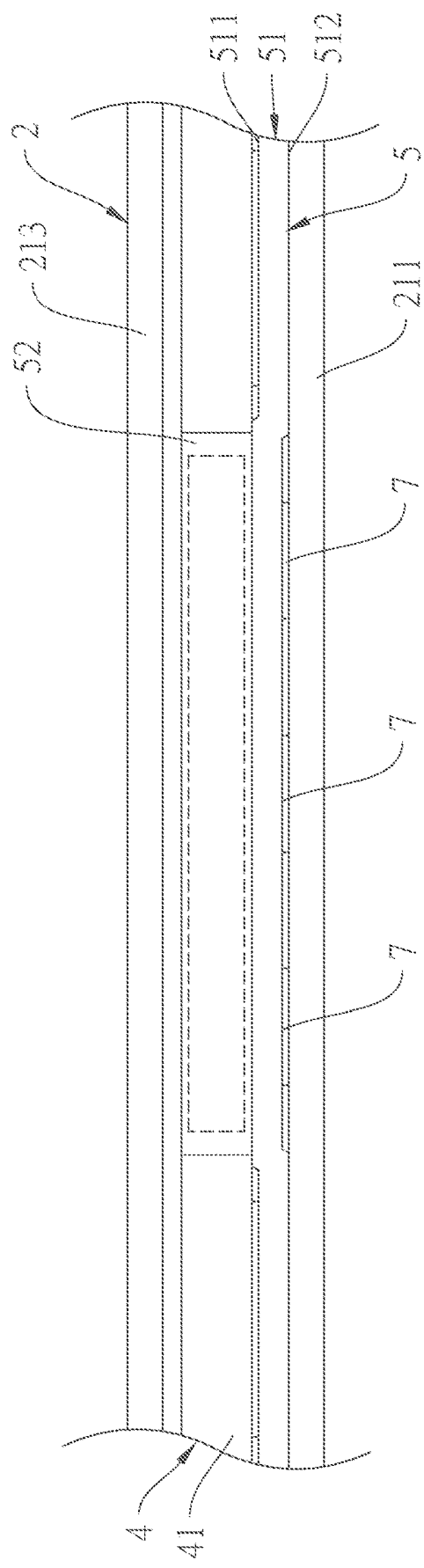
FIG. 4 is a partial sectional diagram illustrating another form of the first preferred embodiment, wherein the flexible circuit board is on the bottom, and the light-emitting elements are on the top.

As shown in FIG. 2 and FIG. 3, the flexible circuit board 51 of the light-emitting unit 5 is at the top, and the light-emitting elements 52 are below the flexible circuit board 51. Therefore, the second surface 512 of the flexible circuit board 51 is abutted by the abutting structures 7 and the extending section 213 above, causing the flexible circuit board 51 to deform downward at the position of the abutting structures 7, push down the light-emitting elements 52 to align with the light incident surface 41 of the light guide plate 4. In some embodiments, as shown in FIG. 4, the light-emitting elements 52 of the light-emitting unit 5 are above the flexible circuit board 51. Therefore, the second surface 512 of the flexible circuit board 51 is attached to the carrying section 211 of the back frame 21 and is pushed against by the abutting structures 7 and the carrying section 211 below. Thereby, the flexible circuit board 51 is deformed upward at the position of the abutting structures 7 and at the same time pushed upward the light-emitting elements 52 to align with the light-incident surface 41 of the light guide plate 4. Therefore, no matter whether the back frame 21 has the extending section 213 or not, it can be assembled with the flexible circuit board 51, which expands the range of application. In addition, the assembly method shown in FIG. 4 allows the operator to facilitate the alignment and assembly in a direct viewing manner, saving the assembly time.

Figure 5:
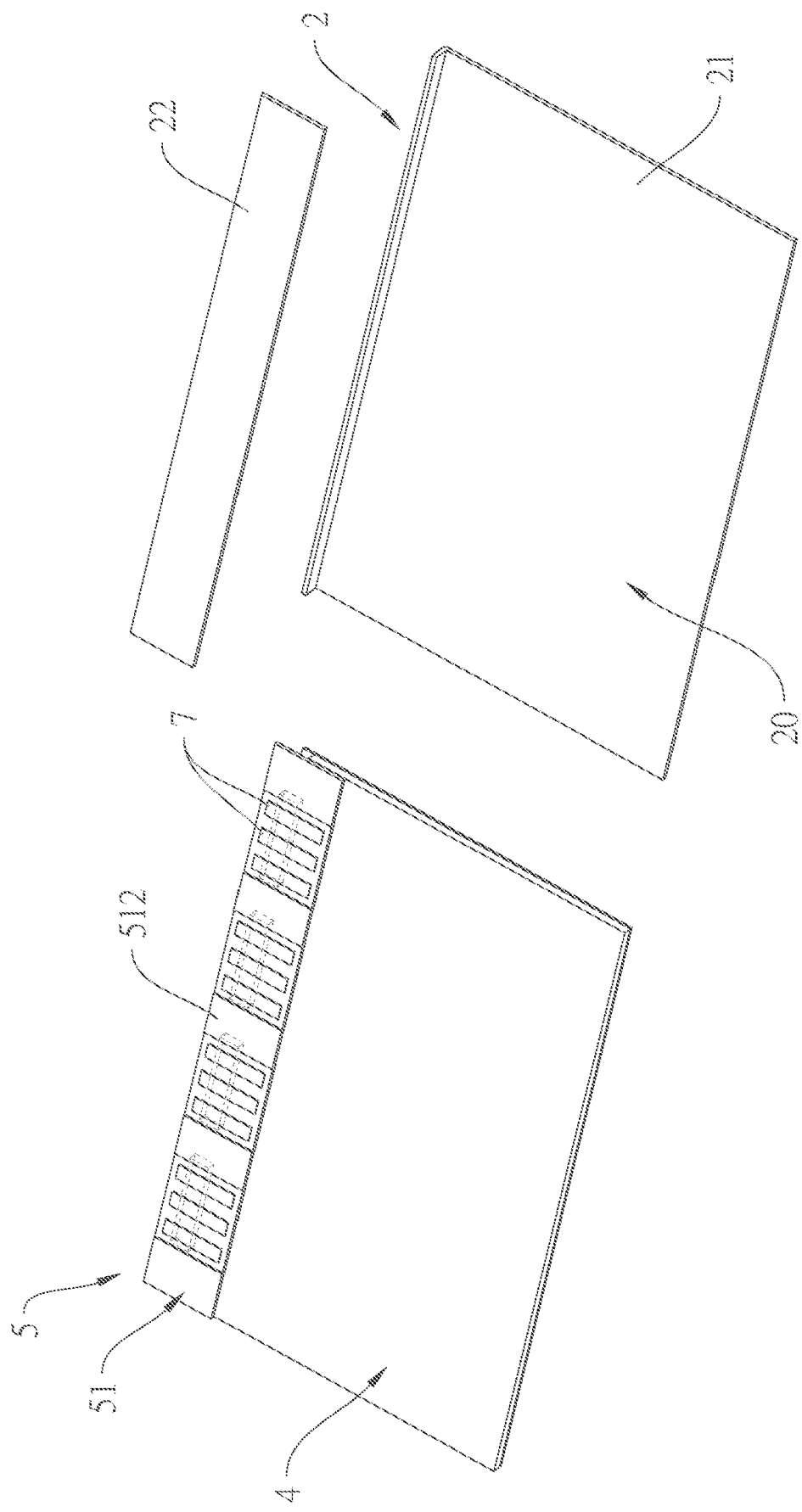
FIG. 5 is a three-dimensional exploded diagram illustrating another form of the first preferred embodiment, wherein an outer frame unit includes an upper frame and a back frame.

It should be noted that, in the first preferred embodiment, the accommodating space 20 is surrounded by the back frame 21 alone, as shown in FIG. 2. In some embodiments, as shown in FIG. 5, the outer frame unit 2 may include the back frame 21, and an upper frame 22 disposed on the back frame 21. The back frame 21 and the upper frame 22 jointly surround the accommodating space 20. The light-emitting unit 5 and the light guide plate 4 are limited in the accommodating space 20. The second surface 512 of the flexible circuit board 51 is attached to the upper frame 22, and the abutting structures 7 abut against the flexible circuit board 51 by the upper frame 22. In this way, the flexible circuit board 51 can be applied to the outer frame unit 2 in different forms, thereby expanding the range of application. Therefore, if the outer frame unit 2 adopts the back frame 21 of a single component, it is beneficial to reduce the inventory of various components and save management costs. If the outer frame unit 2 is composed of two parts, the back frame 21 and the upper frame 22, the light emitting unit 5 can be assembled on the upper frame 22 which is easy to see directly, which is helpful for assembly alignment and saves the assembly time. When rework is required, the upper frame 22 can also be simply replaced without replacing the entire back frame 21. The above description is only the implementation form of this embodiment and should not be limited to the description of this embodiment.

Figure 6:
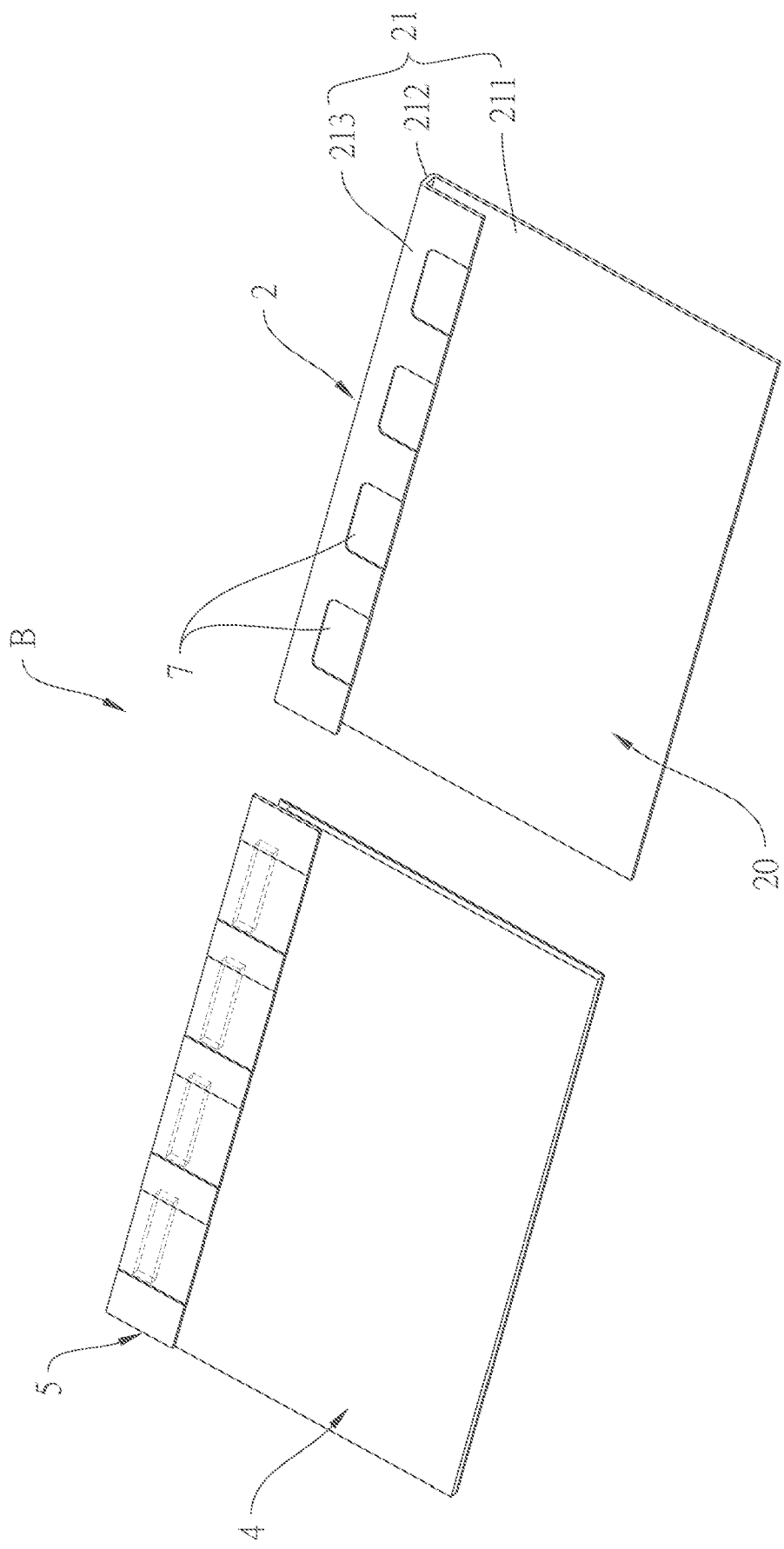
FIG. 6 is a three-dimensional exploded diagram according to a second preferred embodiment of a backlight module of this invention.

Referring to FIG. 6, it is the second preferred embodiment of the backlight module B of the present invention. The second preferred embodiment is substantially the same as the first preferred embodiment. The outer frame unit 2 includes the back frame 21. The back frame 21 also includes the carrying section 211 for carrying the light guide plate 4, the connecting section 212 connecting the carrying section 211, and the extending section 213 connected to the connecting section 212 and extending in the same direction as the carrying section 211. The carrying section 211, the connecting section 212, and the extending section 213 jointly surround the accommodating space 20. The light-emitting unit 5 and the light guide plate 4 are limited in the accommodating space 20. The difference between the second preferred embodiment and the first preferred embodiment is that the abutting structures 7 are protruding structures formed on the extending section 213 of the back frame 21 of the outer frame unit 2.

Figure 7:
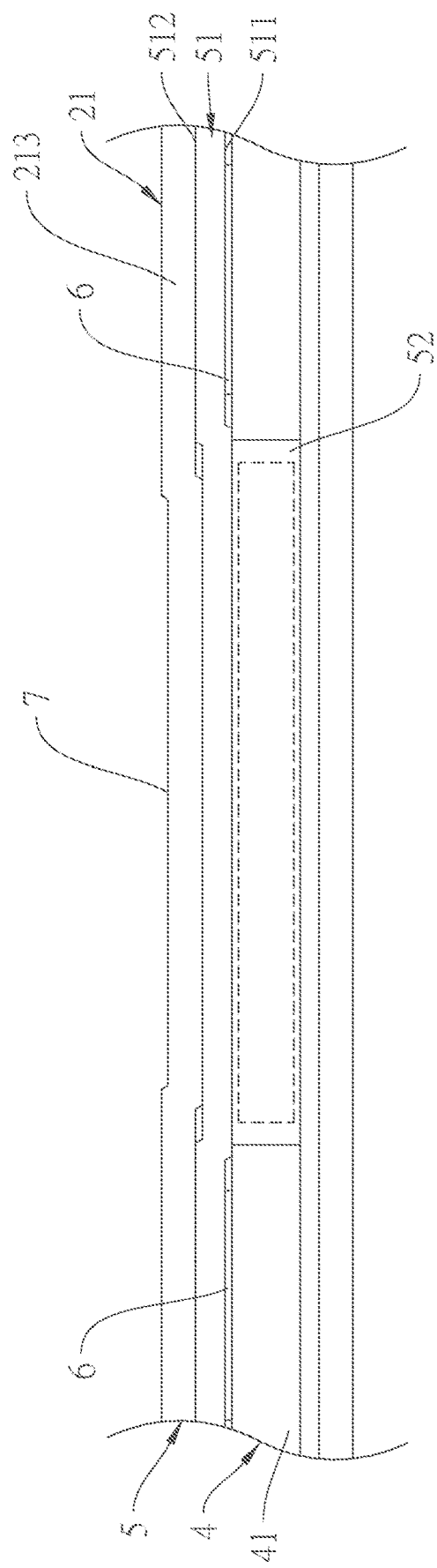
FIG. 7 is a partial sectional diagram illustrating the relative positions between the components in the second preferred embodiment, wherein the flexible circuit board is on the top, and the light-emitting elements are on the bottom.

Referring to FIG. 6 and FIG. 7, the light guide plate 4 is combined with the first surface 511 of the flexible circuit board 51 with the adhesives 6 when assembling. Next, the light guide plate 4 and the light-emitting unit 5 are placed and limited in the accommodating space 20. At this time, as shown in FIG. 7, the second surface 512 of the flexible circuit board 51 is attached to the extending section 213 of the back frame 21. Therefore, the abutting structures 7 located at the extending section 213 will abut against the flexible circuit board 51 and causing the flexible circuit board 51 to deform at the positions corresponding to the abutting structures 7. Since the abutting structures 7 are disposed corresponding to the position of the light-emitting elements 52, the position of the light-emitting elements 52 relative to the light guide plate 4 can be adjusted to align with the light incident surface 41 of the light guide plate 4.

Figure 8:
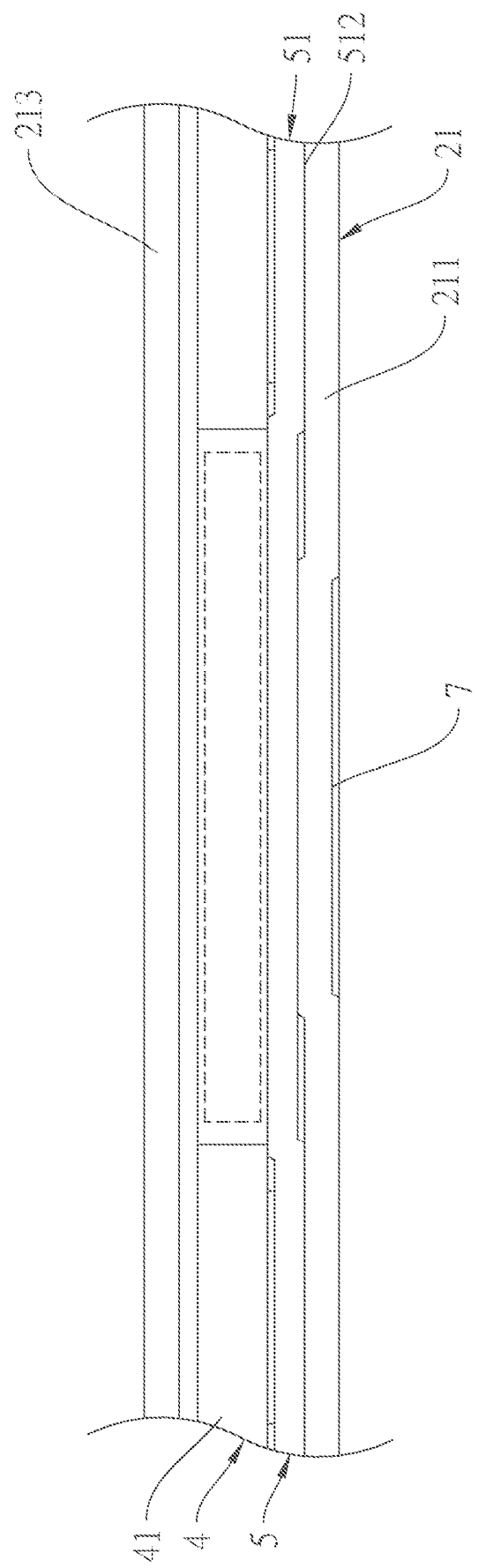
FIG. 8 is a partial sectional diagram illustrating another form of the second preferred embodiment, wherein the flexible circuit board is on the bottom, and the light-emitting elements are on the top.
Figure 9:
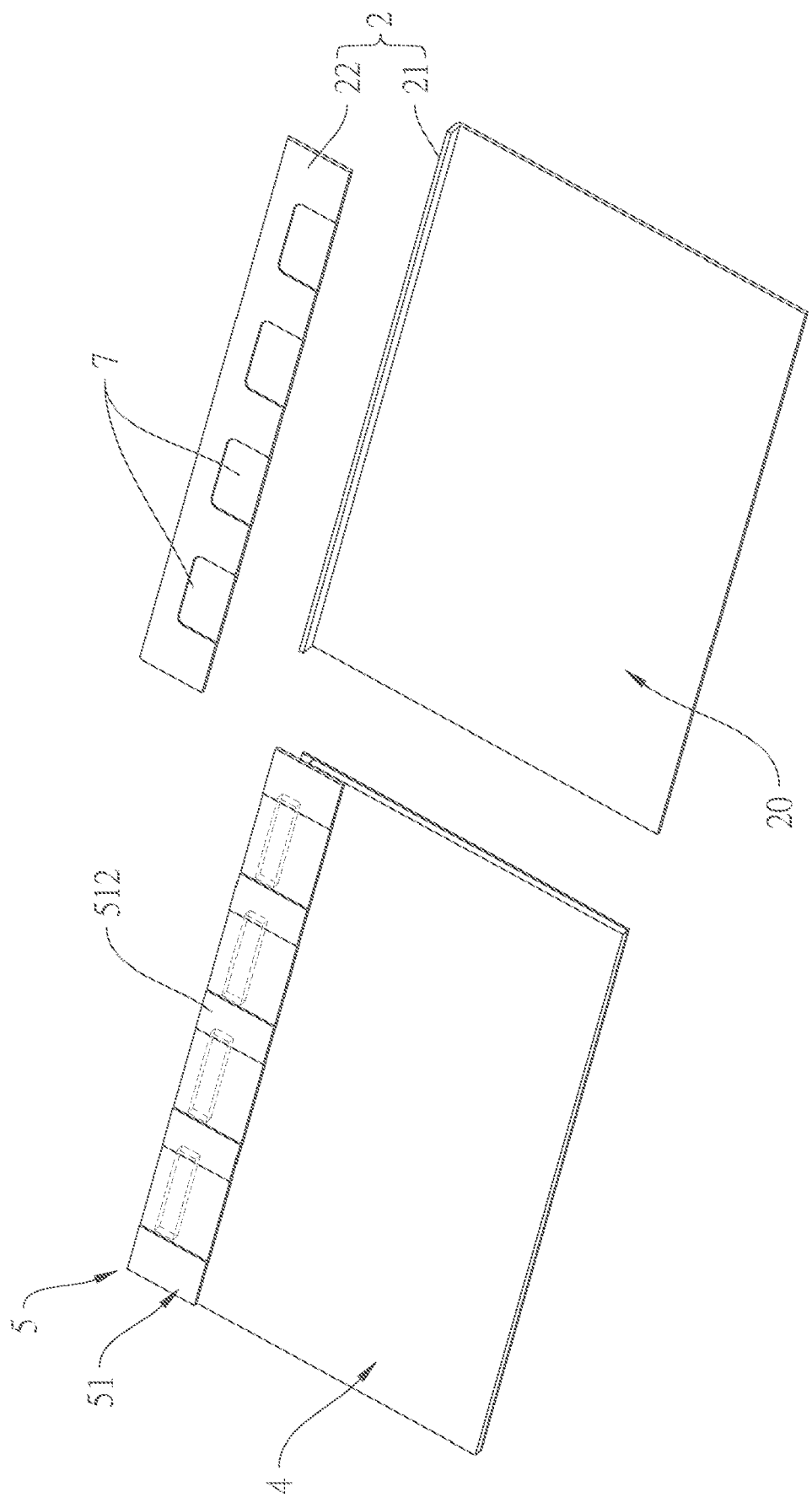
FIG. 9 is a three-dimensional exploded diagram illustrating another form of the second preferred embodiment, wherein the outer frame unit includes an upper frame and a back frame.

As shown in FIG. 7, the flexible circuit board 51 of the light-emitting unit 5 is at the top, and the light-emitting elements 52 are below the flexible circuit board 51. Therefore, the abutting structures 7 are formed on the extending section 213 and abut against the second surface 512 of the flexible circuit board 51. In some embodiments, as shown in FIG. 8, the abutting structures 7 are formed on the carrying section 211 of the back frame 21, and the light-emitting elements 52 of the light-emitting unit 5 are above the flexible circuit board 51. Therefore, the second surface 512 of the flexible circuit board 51 is attached to the carrying section 211, so that the abutting structures 7 can abut against the flexible circuit board 51 so that the light-emitting elements 52 are pushed to align with the light incident surface 41 of the light guide plate 4. Therefore, no matter whether the back frame 21 has the extending section 213 or not, it can be assembled with the flexible circuit board 51, which expands the range of application. In addition, the assembly method shown in FIG. 8 allows the light-emitting unit 5 to be easily assembled on the back frame 21 in a direct-view manner, which is helpful for assembly alignment and saves assembly time.

In some embodiments, as shown in FIG. 5, the outer frame unit 2 may include the back frame 21, and an upper frame 22 disposed on the back frame 21. The back frame 21 and the upper frame 22 jointly surround the accommodating space 20. The light-emitting unit 5 and the light guide plate 4 are limited in the accommodating space 20. The second surface 512 of the flexible circuit board 51 is attached to the upper frame 22, and the abutting structures 7 are formed on the upper frame 22 to the flexible circuit board 51. In this way, the flexible circuit board 51 can be applied to the outer frame unit 2 in different forms, expanding the range of application. Therefore, if the outer frame unit 2 adopts the back frame 21 of a single component, it is beneficial to reduce the inventory of various components and save management costs. If the outer frame unit 2 is composed of two parts, the back frame 21 and the upper frame 22, the light emitting unit 5 can be assembled on the upper frame 22 which is easy to see directly, which is helpful for assembly alignment and saves the assembly time. When rework is required, the upper frame 22 can also be simply replaced without replacing the entire back frame 21. The above description is only the implementation form of this embodiment and should not be limited to the description of this embodiment.

In the second preferred embodiment, the abutting structures 7 are directly formed on the back frame 21, therefore, the abutting structures 7 can be molded at the same time when the back frame 21 is manufactured. In this way, the processing procedure and the manufacturing cost can be reduced in the whole manufacturing process.

Figure 10:
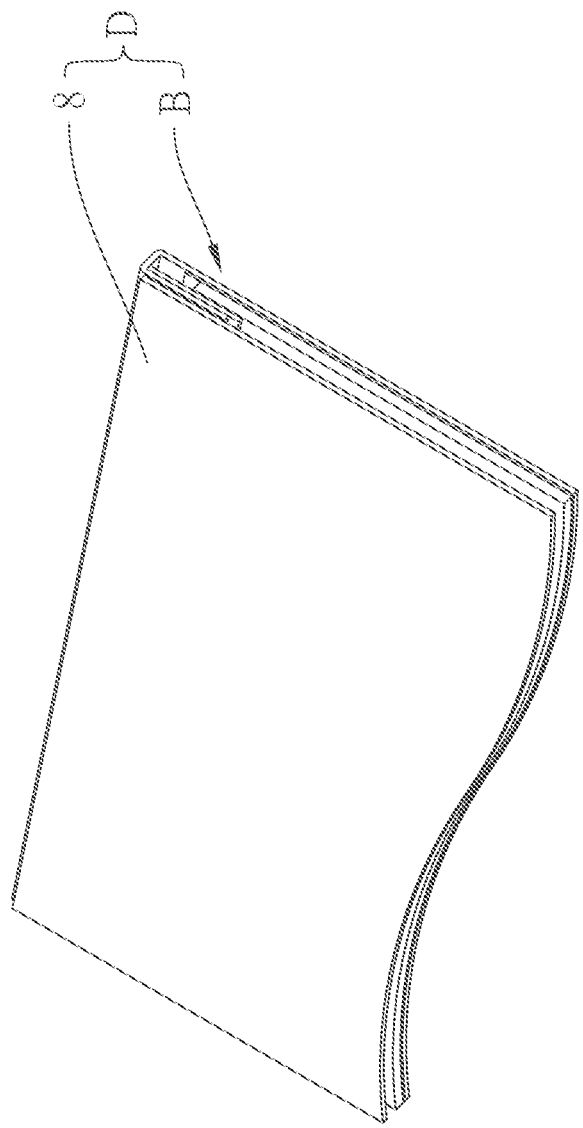
FIG. 10 is a perspective diagram of a preferred embodiment of the display device of the present invention.

A display device D shown in FIG. 10 is the aforementioned backlight module B combined with a display panel 8.

To sum up, according to the backlight module B and the display device D of the present invention, the setting of the abutting structures 7 can abut against the position corresponding to the light-emitting elements 52 on the flexible circuit board 51 by utilizing the flexibility of the flexible circuit board 51 to generate deformation to compensate for the thickness of adhesives 6. In this way, the position of the light-emitting elements 52 relative to the light guide plate 4 are adjusted, and the coupling effect between the light guide plate 4 and the light-emitting elements 52 is optimized. At the same time, it prevents light from leaking from the light-emitting surface of the light guide plate 4 close to the position of the light-emitting elements 52, reduces the generation of bright lines, and improves the overall uniformity.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A backlight module, comprising:
   an outer frame unit;
   a light guide plate, arranged in the outer frame unit, wherein the light guide plate has a light incident surface;
   a light-emitting unit, including a flexible circuit board, and a plurality of light-emitting elements arranged at intervals on the flexible circuit board, wherein the flexible circuit board has a first surface and a second surface opposite to the first surface, and the light-emitting elements are arranged on the first surface and emit light toward the light incident surface of the light guide plate;
   a plurality of adhesives, used to fix the flexible circuit board on the light guide plate, wherein the adhesives are arranged at intervals, and each of the light-emitting elements is corresponding to the space between two adjacent adhesives; and
   a plurality of abutting structures, arranged corresponding to the position of the light-emitting elements, wherein the abutting structures abut against the second surface of the flexible circuit board, and the flexible circuit board is deformed at the position of the abutting structures; and
   wherein the first surface of the flexible circuit board forms a coplanar surface with the surface of the plurality of adhesives, and the light-emitting elements arranged on the flexible circuit board where deformed are aligned with the light incident surface of the light guide plate.

2. The backlight module as claimed in claim 1, wherein the abutting structures are protruding structures formed on the second surface of the flexible circuit board.

3. The backlight module as claimed in claim 2, wherein the outer frame unit includes a back frame, the back frame has a carrying section for carrying the light guide plate, the second surface of the flexible circuit board is attached to the carrying section, and the abutting structures abut against the flexible circuit board by the abutment of the carrying section.

4. The backlight module as claimed in claim 2, wherein the outer frame unit includes a back frame, the back frame has a carrying section for carrying the light guide plate, a connecting section connected to the carrying section, and an extending section connected to the connecting section and extending in the same direction as the carrying section, wherein the carrying section, the connecting section, and the extending section jointly surround an accommodating space, the light-emitting unit and the light guide plate are limited in the accommodating space, the second surface of the flexible circuit board is attached to the extending section, and the abutting structures abut against the flexible circuit board by the abutment of the extending section.

5. The backlight module as claimed in claim 2, wherein the outer frame unit includes a back frame and an upper frame arranged on the back frame, the back frame and the upper frame jointly surround an accommodating space, the light-emitting unit and the light guide plate are limited in the accommodating space, the second surface of the flexible circuit board is attached to the upper frame, and the abutting structures abut against the flexible circuit board by the abutment of the upper frame.

6. The backlight module as claimed in claim 1, wherein the abutting structures are protruding structures formed on the outer frame unit.

7. The backlight module as claimed in claim 6, wherein the outer frame unit includes a back frame, the back frame has a carrying section for carrying the light guide plate, the second surface of the flexible circuit board is attached to the carrying section, and the abutting structures are formed on the carrying section and abut against the flexible circuit board.

8. The backlight module as claimed in claim 6, wherein the outer frame unit includes a back frame, the back frame has a carrying section for carrying the light guide plate, a connecting section connected to the carrying section, and an extending section connected to the connecting section and extending in the same direction as the carrying section, wherein the carrying section, the connecting section, and the extending section jointly surround an accommodating space, the light-emitting unit and the light guide plate are limited in the accommodating space, the second surface of the flexible circuit board is attached to the extending section, and the abutting structures are formed on the extending section and abut against the flexible circuit board.

9. The backlight module as claimed in claim 6, wherein the outer frame unit includes a back frame and an upper frame arranged on the back frame, the back frame and the upper frame jointly surround an accommodating space, the light-emitting unit and the light guide plate are limited in the accommodating space, the second surface of the flexible circuit board is attached to the upper frame, and the abutting structures are formed on the upper frame to abut against the flexible circuit board.

10. The backlight module as claimed in claim 1, wherein the first surface of the flexible circuit board has a plurality of fixing areas where the adhesives are disposed and a plurality of setting areas where the light-emitting elements are disposed, and the fixing areas and the setting areas are not coplanar.

11. The backlight module as claimed in claim 1, wherein the first surface of the flexible circuit board forms protrusions at the position of the abutting structures.

12. A display device, comprising the backlight module as described in claim 1, and a display panel arranged on the backlight module.

* * * * *